United States Patent
Spiegel et al.

(10) Patent No.: US 6,992,545 B2
(45) Date of Patent: Jan. 31, 2006

(54) GPS LOW NOISE AMPLIFIER UNIT, DUPLEX FILTER UNIT AND GPS-CELLULAR HAND-SET

(75) Inventors: Solon Spiegel, Zurich (CH); Imre Kovacs, Adliswil (CH)

(73) Assignee: U-BLOX AG, Thalwil (CH)

( * ) Notice: Subject to any disclaimer, the term of this patent is extended or adjusted under 35 U.S.C. 154(b) by 499 days.

(21) Appl. No.: 10/217,414

(22) Filed: Aug. 14, 2002

(65) Prior Publication Data

US 2003/0048137 A1 Mar. 13, 2003

(30) Foreign Application Priority Data

Sep. 7, 2001 (EP) .................................. 01810860

(51) Int. Cl.
*H03H 7/46* (2006.01)
(52) U.S. Cl. .................. 333/132; 333/32; 330/302; 330/306
(58) Field of Classification Search ............... 333/132, 333/32, 17.3; 330/302, 306
See application file for complete search history.

(56) References Cited

U.S. PATENT DOCUMENTS

| | | | | |
|---|---|---|---|---|
| 5,117,203 A | * | 5/1992 | Tennyson | 330/294 |
| 5,117,326 A | * | 5/1992 | Sano et al. | 361/321.4 |
| 5,507,011 A | * | 4/1996 | Chigodo et al. | 455/82 |
| 5,963,180 A | | 10/1999 | Leisten | |
| 5,969,582 A | | 10/1999 | Boesch et al. | |
| 6,208,844 B1 | | 3/2001 | Abdelgany | |
| 6,430,415 B1 | * | 8/2002 | Agashe et al. | 455/456.5 |
| 6,628,176 B1 | * | 9/2003 | Okada | 333/32 |

* cited by examiner

*Primary Examiner*—Robert Pascal
*Assistant Examiner*—Kimberly Glenn
(74) *Attorney, Agent, or Firm*—Oblon, Spivak, McClelland, Maier & Neustadt, P.C.

(57) ABSTRACT

A GPS-cellular hand-set includes a receive antenna; a separate transmit antenna; a power amplifier; a duplex filter unit having an input connected to the receive antenna, a cellular output, and a GPS output; a cellular unit having a receive input and a transmit output, wherein the receive input is connected to the cellular output of the duplex filter unit and the transmit output is connected to the transmit antenna via the power amplifer; and a GPS unit having an input connected to the GPS output of the duplex filter unit.

8 Claims, 4 Drawing Sheets

GPS LOW NOISE AMPLIFIER UNIT, DUPLEX FILTER UNIT AND GPS-CELLULAR HAND-SET

FIELD OF THE INVENTION

The invention relates to a GPS low noise amplifer unit with integrated filter, an active duplex filter unit for a combined GPS-cellular receiver front-end as well as a combined GPS-cellular hand-set.

PRIOR ART

Hand-sets combining a cellular telephone with a GPS-receiver have been known for some time. One such apparatus is described in U.S. Pat. No. 5,963,180. It comprises an antenna mounted on a diplexer unit connecting the antenna to a cellular telephone and a GPS receiver via a duplex filter. The antenna functions as a cellular transmit and receive antenna as well as a GPS antenna. The GPS part is shielded from the high power transmit signal only by the duplex filter.

The RF front-ends of such hand-sets are subject to particularly stringent requirements. The main reason for this lies in the simultaneous operation of the cellular transmitter and the closely integrated GPS receiver. As a consequence, the weak GPS signal needs to be detected in the presence of a much stronger cellular transmit signal. Considering the weakness of the GPS signal, it must at the same time be processed with minimum degradation of the signal-to-noise ratio.

The requirements can be fulfilled in principle by increasing the current levels of the device or additional RF filtering between the antenna and the GPS low noise amplifier. The first obviously implies higher power consumption whereas the latter leads to a higher system noise figure and requires extra components. Increase in power consumption and additional components are highly undesirable in a circuit for a hand-set.

SUMMARY OF THE INVENTION

The invention provides a GPS low noise amplifier unit with high gain and low noise figure at the GPS frequency which at the same time acts as a filter with strong suppression in particular of cellular transmit frequencies, making the hand-set largely immune to strong out-of-band interferers, in particular the cellullar transmitter leakage signal. GPS in-band noise originating from the intermodulation distortion as well as desensitization of the GPS receiver are also reduced. Finally, the number of external components of the GPS low noise amplifier as well as the duplex filter unit according to the invention is small as is desired in a circuit for hand-sets.

The invention also provides an active duplex filter unit with low noise and high gain at the GPS frequency band and strong suppression of frequencies used by the cellular system and vice versa.

At the same time, power consumption of the GPS-cellular hand-set according to the invention is low because the output signal of the power amplifier can be fed directly to the transmit antenna without being attenuated by filtering. Due to low losses in the transmission path less output power is required at the power amplifier. Also, the second order intercept point requirements of the cellular receiver are reduced because of the considerable attenuation of the transmitter leakage signal achieved by the separation of transmit antenna and receive antenna.

The invention provides for a GPS-cellular hand-set which works well even under difficult conditions and is at the same time light weight and compact and has low power consumption.

BRIEF DESCRIPTION OF THE DRAWINGS

In the following the invention is described in more detail with reference to drawings referring to an embodiment of the invention in which.

DESCRIPTION OF THE PREFERRED EMBODIMENTS

Figure 1:
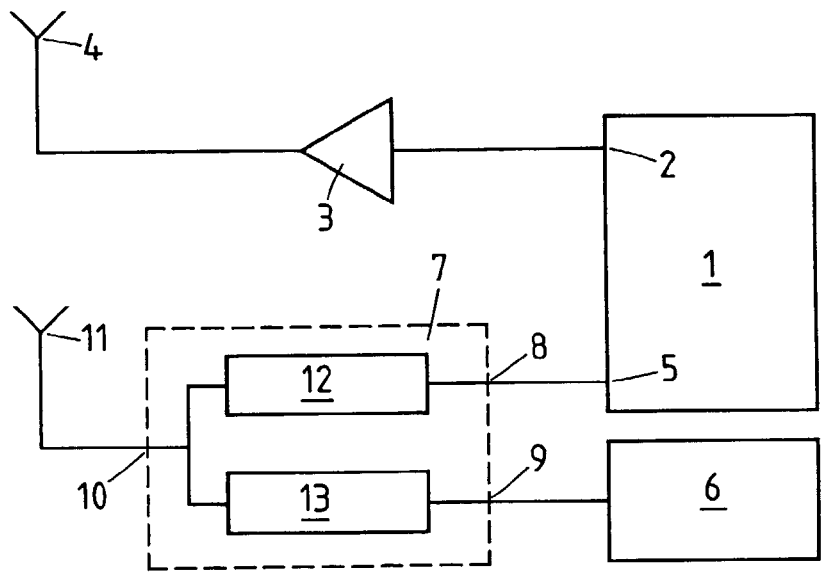
FIG. 1 is a diagram representing a hand-set according to the invention.
Figure 2:
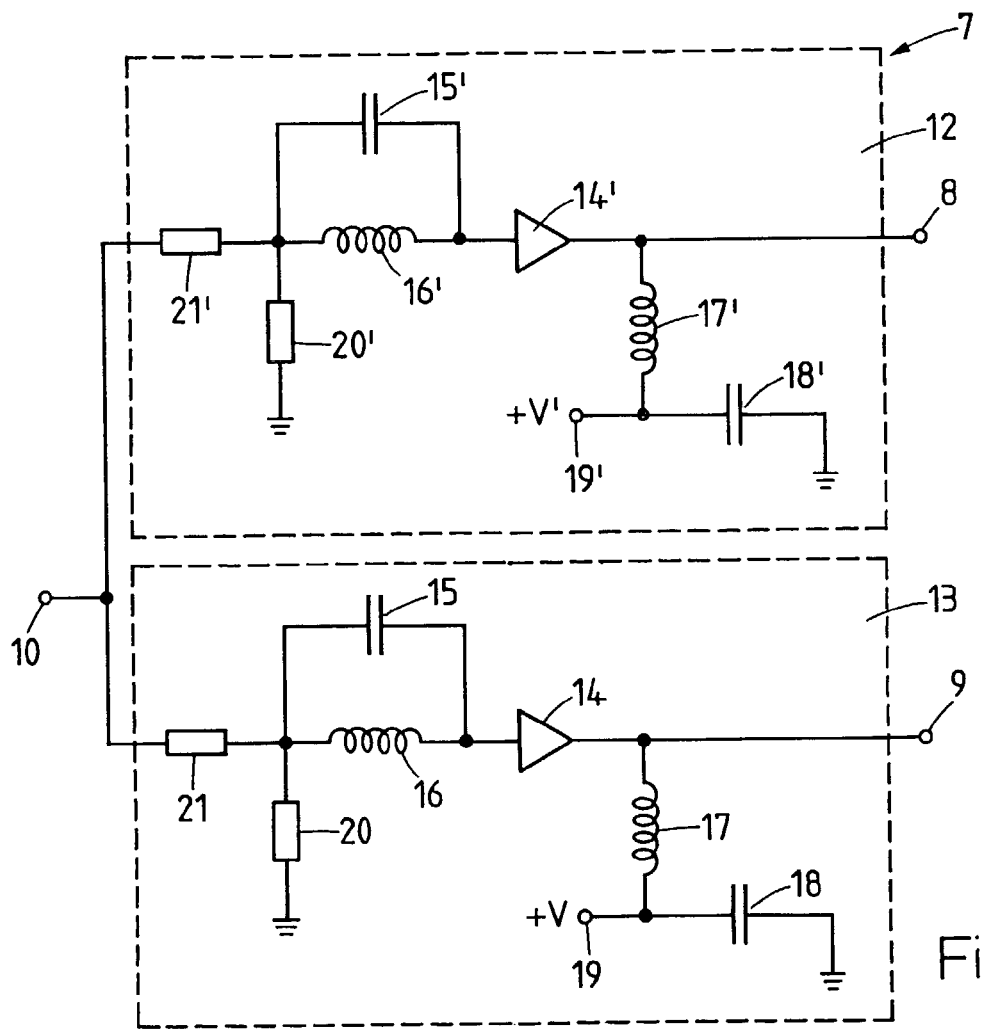
FIG. 2 is a diagram showing the duplex filter unit according to the invention in more detail.

The GPS-cellular hand-set according to the invention comprises (FIG. 1) a cellular unit 1 with a transmit output 2 which is, via a selective power amplifier 3, connected to a transmit antenna 4. A receive input 5 of the cellular unit 1 and the input of a GPS unit 6 are connected to an active duplex filter unit 7, i.e. to a cellular output 8 and a GPS output 9, respectively, of the same. An input 10 of the duplex filter unit 7 is connected to a receive antenna 11 with two resonance frequencies, e.g., a quadrifilar helical antenna as known from U.S. Pat. No. 5,963,180 or a circular microstrip antenna as described in Jui-Han Lu: 'Novel Dual-Frequency Design of Circular Microstrip Antenna with Compact Operation'.

The duplex filter unit 7 contains a cellular low noise amplifier unit 12 and a GPS low noise amplifier unit 13. The inputs of both are connected to the input 10 of the duplex filter unit 7 and their outputs to the cellular output 8 and the GPS output 9, respectively, of the same. The cellular unit 1 comprises conventional components of a cellular receiver and transmitter whereas the GPS unit 6 comprises equally conventional components of a GPS receiver. The duplex filter unit 7 serves as a combined GPS-cellular receiver front-end. Further components of the hand-set like microphone, loudspeaker and display are not shown in FIG. 1.

The separation of transmit antenna 4 and receive antenna 11 strongly attenuates leakage of the transmit signal into the duplex filter unit 7. In comparison with prior art devices, the requirements on the latter, in particular the nonlinearity constraints on the cellular low noise amplifier unit 12, are thereby alleviated. As power amplifier 3 can be directly connected to transmit antenna 4 its output signal is not attenuated by a duplex filter. As a consequence, a lower output level is sufficient and power consumption of the amplifier is significantly reduced.

The GPS low noise amplifier unit 13 comprises an amplifier 14, a low noise solid state device to which its input is connected via a first filter unit, a resonator containing, in parallel, a capacitance 15 and an inductance 16. Its output is connected to the output of amplifier unit 13 and, via a second filter unit, to ground. The second filter unit comprises, in series, an inductance 17 and a capacitance 18 with a tap 19 between them where a bias voltage +V is applied. The input of GPS low noise amplifier unit 13 is connected to ground via a shunt 20 which is either an inductance or a capacitance. The impedance of the line connecting the GPS low noise amplifier unit 13 to receive antenna 11 is represented as line impedance 21. The components of GPS low noise amplifier unit 13 may have the following values:

| capacitance 15: | 3,4 pF |
|---|---|
| inductance 16: | 1,5 nH |
| inductance 17: | 6,8 nH |
| capacitance 18: | 1,2 nF |

Shunt 20 can be an inductance with a value of 39 nH. As to line impedance 21, the electrical length of the line is tuned to provide a high impedance of the GPS low noise amplifier unit 13 for signals in the cellular frequency range at the input.

Figure 3:
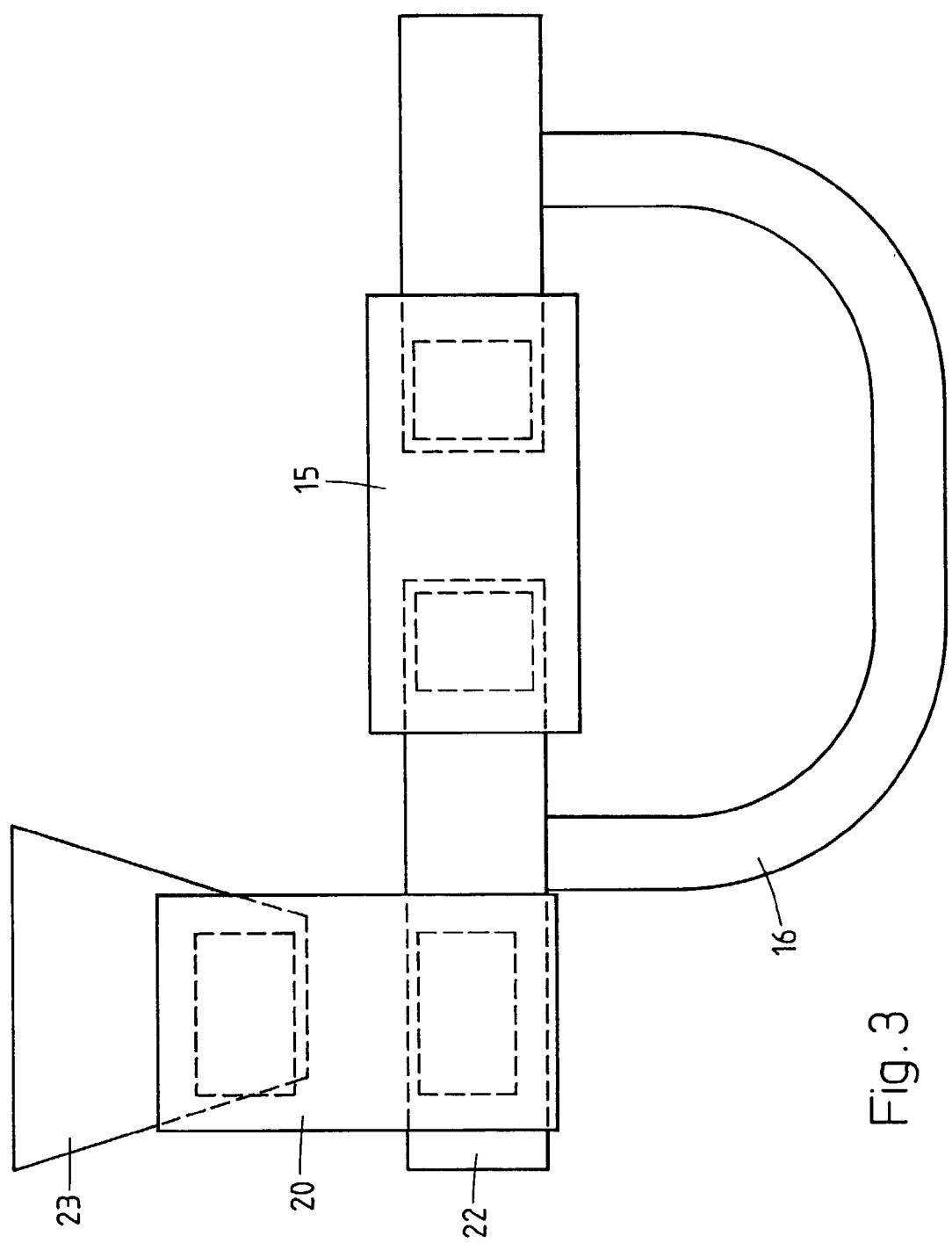
FIG. 3 shows a layout of a first filter unit of the GPS low noise amplifier unit according to the invention.

The first filter unit of GPS low noise amplifier unit 13 which precedes amplifier 14 comprises an FR4 laminated organic carrier with conductor strips applied to its surface (FIG. 3). An antenna connection 22 which serves to connect the first filter unit to the input 10 of the duplex filter unit 7 is connected to a ground plane 23 via shunt 20 which can be a printed spiral inductor or, as indicated in FIG. 3, a surface-mounted external component. Capacitance 15 is also a surface-mounted component, preferably a high frequency ceramic capacitor as a high Q factor of the resonator is required. Inductance 16 is directly synthesized on the substrate as a high impedance transmission line. The Q factor of the resonator can be improved by replacing the low cost substrate by a substrate with better electrical properties where necessary. Inductance 17 and capacitance 18 are discrete components.

Cellular low noise amplifier unit 12 has preferably the same structure as GPS low noise amplifier unit 13, with components 14'–20' and line impedance 21'. Their values can be similar, subject to the differing filter characteristics required. The first filter unit of cellular low noise amplifier unit 12 can be implemented in essentially the same way as the first filter unit of GPS low noise amplifier unit 13. As regards line impedance 21', the electrical length of the line is adapted so as to provide high impedance of the cellular low noise amplifier 12 for signals at the GPS frequency band at the input.

Consequently, the cellular low noise amplifier unit 12 does not load the receiver antenna 11 at the GPS frequency band, presenting a high impedance. Similarly, loading of the GPS low noise amplifier unit 13 at frequencies used by the cellular systems is kept at low levels. Due to the less stringent noise requirements of the cellular receiver the requirements are comparatively relaxed, however. Also, the selectivity requirements of the cellular low noise amplifier unit 12 are not severe because of the weakness of the GPS signal which is below the thermal noise level. As the transmitter leakage signal is considerably attenuated by the separation of the receive antenna 11 from the transmit antenna 4, second order intercept point requirements are relaxed.

Cellular low noise amplifier unit 12 and GPS low noise amplifier unit 13 amplify the signals in the cellular and GPS frequency range and strongly suppress signals pertaining to complementary frequency ranges, respectively. At the same time, they provide noise impedance matching in the frequency range occupied by cellular systems and at the GPS frequency, respectively.

Figure 4:
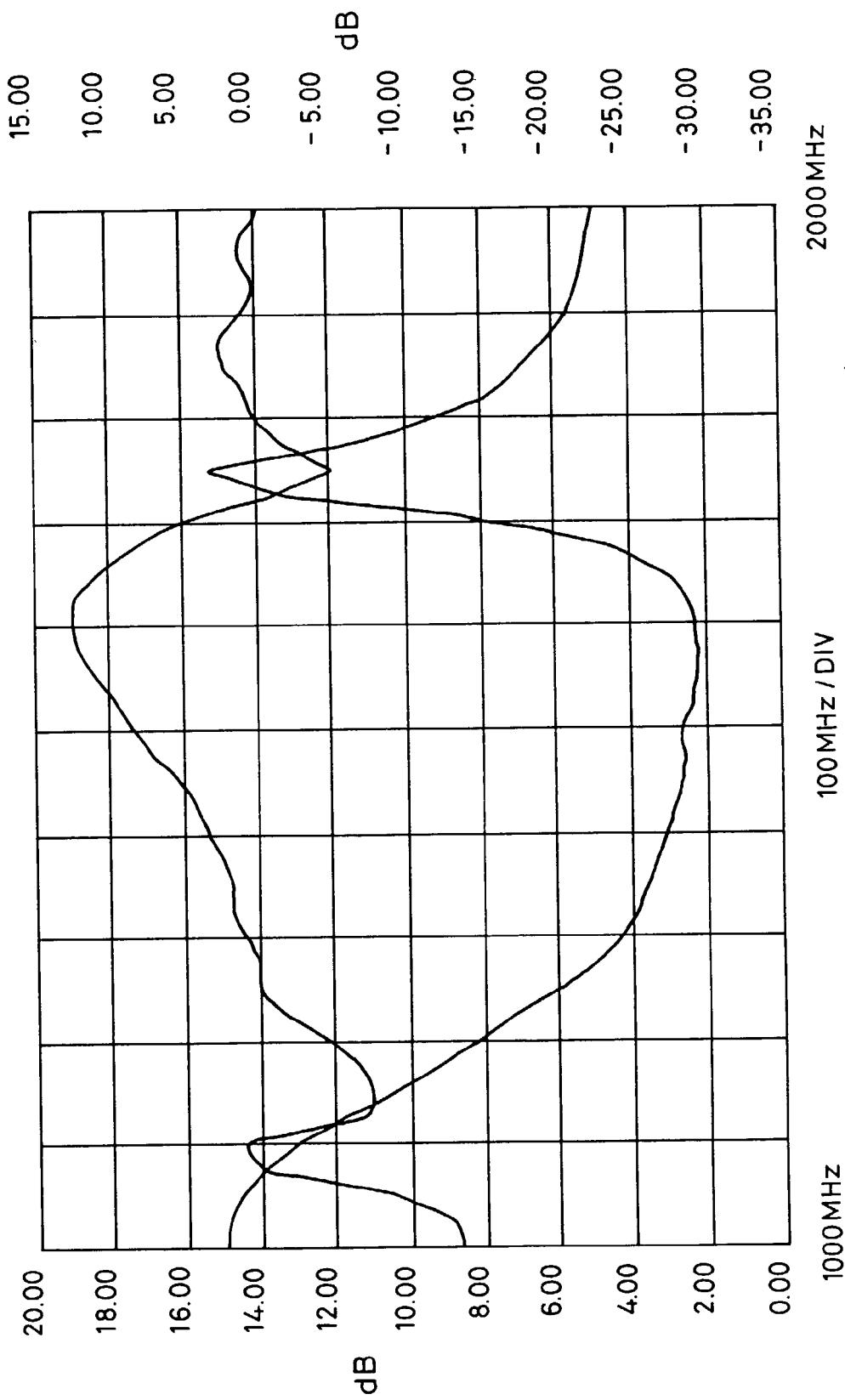
FIG. 4 is a diagram showing gain and noise figure of the GPS low noise amplifier according to the invention as a function of frequency.

As is apparent from the measured results concerning insertion gain (right scale) and noise figure (left scale) as a function of frequency shown in FIG. 4, the GPS low noise amplifier unit 13 according to the invention shows an insertion gain of 12.5 dB and a minimum noise figure of 2.3 dB at the GPS center frequency. The influence of the resonator shows in a notch in the frequency response at the lowest frequency (1'710 MHz) of the transmission band of the cellular system. The minimum selectivity in the frequency range occupied by the same is at least 10 dB at the stop band. Due to the improvement of the selectivity close to the GPS frequency blocking signals, in particular cellular transmitter leakage signals are significantly attenuated at the input stage. Therefore, the GPS low noise amplifier unit 13 can handle high levels of blocking signals. In particular, it is essentially immune to transmitter leakage signals stemming from the transmit antenna 4.

Figure 5:
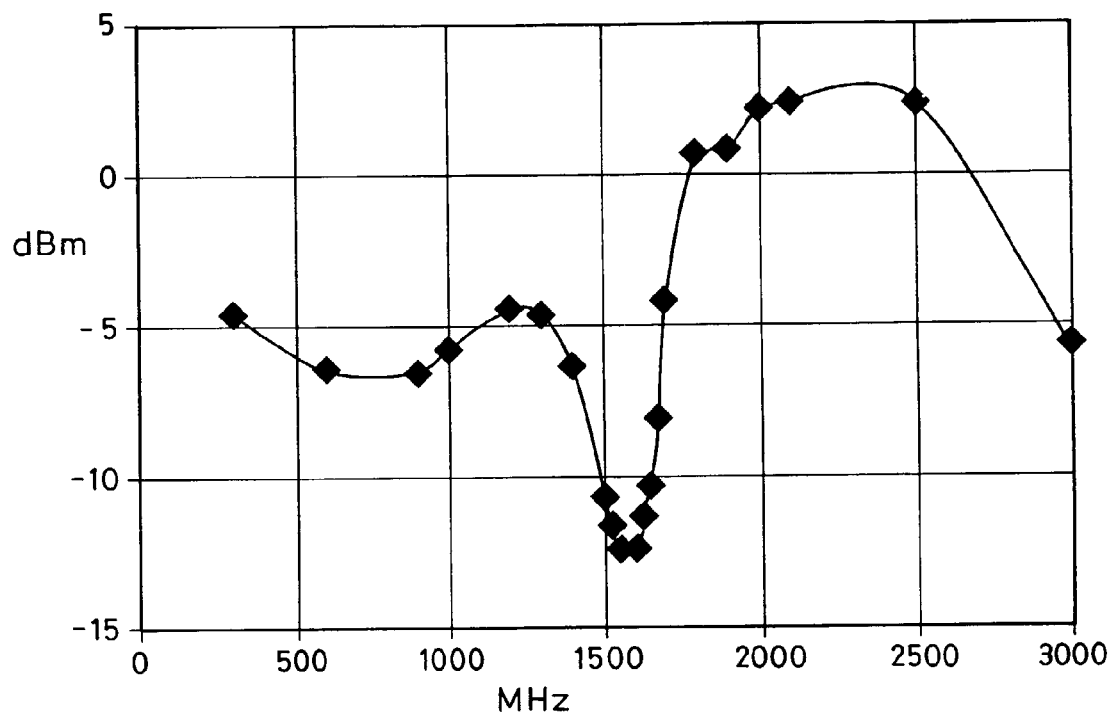
FIG. 5 is a diagram showing the 3 dB gain desensitization blocking signal power of the GPS low noise amplifier unit according to the invention as a function of the frequency of a CW blocking signal.

FIG. 5 shows measured results of the power level of a CW blocking signal causing a 3 dB gain desensitization of the GPS low noise amplifier unit 13 as a function of its frequency. Between 1,700 MHz and 2'600 MHz more than 0 dB blocking power is required to reduce the gain of the GPS low noise amplifier unit 13 by 3 dB at the GPS frequency. This is in agreement with the high rejection levels attained at these frequencies apparent from FIG. 4.

Figure 6:
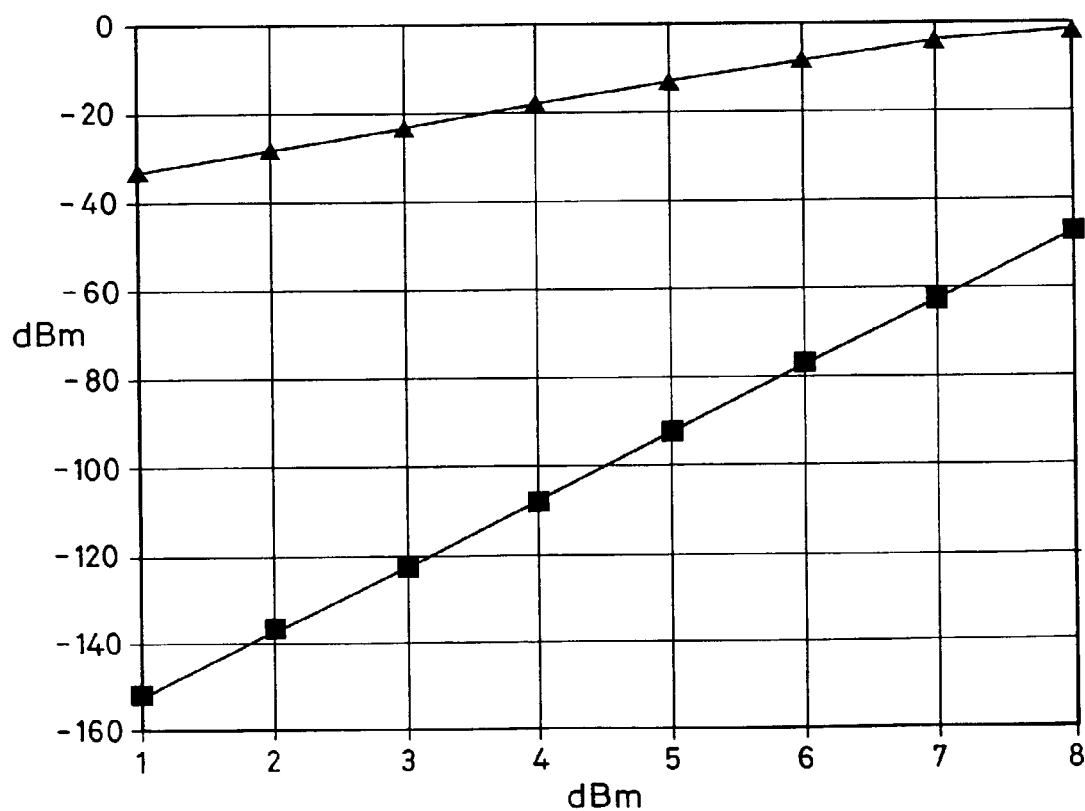
FIG. 6 is a diagram illustrating the gain of the GPS low noise amplifier unit according to the invention as well as the power of the in-band $3^{rd}$ order intermodulation products of two equal CW tones as a function of their power.

FIG. 6 shows two parameters at the output of the GPS low noise amplifier unit 13 at the GPS centre frequency, each as a function of input power. Triangles represent the measured values of the output power, illustrating the gain of the unit. Squares stand for measured values of the power of the in-band $3^{rd}$ order intermodulation products (IM3) at the output. The intermodulation products originated from two CW tones of equal power, at frequencies of 1'750 MHz and 1'925 MHz. It is apparent that the in-band IM3 levels are very low.

LIST OF REFERENCE SYMBOLS 1 cellular unit
2 transmit output
3 power amplifier
4 transmit antenna
5 receive input
6 GPS unit
7 duplex filter unit
8 cellular output
9 GPS output
10 input
11 receive antenna
12 cellular low noise amplifier unit
13 GPS low noise amplifier unit
14, 14' amplifier
15, 15' capacitance
16, 16' inductance
17, 17' inductance
18, 18' capacitance
19, 19' tap
20, 20' shunt
21, 21' line impedance 22 antenna connection
23 ground plane

The invention claimed is:

1. A GPS-cellular hand-set, comprising:
   a receive antenna;
   a separate transmit antenna;
   a power amplifier;
   a duplex filter unit having an input connected to said receive antenna, a cellular output, and a GPS output;
   a cellular unit having a receive input and a transmit output, wherein the receive input is connected to the cellular output of the duplex filter unit and the transmit output is connected to the transmit antenna via the power amplifer; and
   a GPS unit having an input connected to the GPS output of the duplex filter unit.

2. The GPS-cellular hand set according to claim 1, wherein the duplex filter unit comprises:
   a cellular low noise amplifier unit connected between the input and the cellular output; and
   a GPS low noise amplifier unit connected between the input and the GPS output.

3. The GPS-cellular hand-set according to claim 2, wherein the cellular low noise amplifier unit comprises:
   an amplifier;
   a first filter unit having a first capacitance and a first inductance connected in parallel between an input of the first filter and an input of the amplifier; and
   a second filter unit having an output connected to ground, the second filter unit comprising a second inductance and a second capacitance connected in series, and having a tap configured to allow an application of a bias voltage between the second inductance and the second capacitance.

4. The GPS-cellular hand-set according to claim 2, wherein the GPS low noise amplifier unit comprises:
   an amplifier;
   a first filter unit having a first capacitance and a first inductance connected in parallel between an input of the first filter and an input of the amplifier; and
   a second filter unit having an output connected to ground, the second filter unit comprising a second inductance and a second capacitance connected in series, and having a tap configured to allow an application of a bias voltage between the second inductance and the second capacitance.

5. The GPS-cellular hand-set according to claim 4, wherein the GPS low noise amplifier unit further comprises:
   a shunt having an input connected to the ground.

6. The GPS-cellular hand-set according to claim 5, wherein the shunt is either an inductance or a capacitance.

7. The GPS-cellular hand-set according to claim 4, wherein the first inductance is implemented as a high impedance transmission line.

8. The GPS-cellular hand-set according to claim 4, wherein the first capacitance is implemented as a high frequency ceramic capacitor.

* * * * *